(12) United States Patent
Hudyma

(10) Patent No.: US 6,226,346 B1
(45) Date of Patent: *May 1, 2001

(54) REFLECTIVE OPTICAL IMAGING SYSTEMS WITH BALANCED DISTORTION

(75) Inventor: Russell M. Hudyma, San Ramon, CA (US)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,420

(22) Filed: Jun. 9, 1998

(51) Int. Cl.[7] ................................................. G21K 5/00
(52) U.S. Cl. ............................................................ 378/34
(58) Field of Search ............................................... 378/34

(56) References Cited

U.S. PATENT DOCUMENTS

| | | | |
|---|---|---|---|
| 5,063,586 | * 11/1991 | Jewell et al. | 378/34 |
| 5,153,898 | 10/1992 | Suzuki et al. | 378/34 |
| 5,212,588 | 5/1993 | Viswanathan et al. | 359/355 |
| 5,220,590 | 6/1993 | Bruning et al. | 378/34 |
| 5,315,629 | 5/1994 | Jewell et al. | 378/34 |
| 5,353,322 | 10/1994 | Bruning et al. | 378/34 |
| 5,410,434 | 4/1995 | Shafer | 359/858 |

FOREIGN PATENT DOCUMENTS 0 779 528 A2  11/1996  (EP) .

OTHER PUBLICATIONS

Reflective Optical Designs For Soft X–Ray Projection Lithography, T.E. Jewell et al., SPIE vol. 1527 Current Developments in Optical Design and Optical Engineering, 1991, pp. 163–173.

"Design of reflective relay for soft x–ray lithography" by Rodgers et al.; SPIE vol. 1354, International Lens Design Conference (1990).

"Reflective systems design study for soft x–ray projection lithography" by Jewell et al.; J. Vac. Sci. Technol. B 8 (6) Nov./Dec. 1990.

"Optical system design issues in development of projection camera for EUV lithography" by Jewell; SPIE vol. 2437 May 1995.

"Ring–field EUVL camera with large etendu" by W.C. Sweatt, Sandia National Laboratories, (1996).

* cited by examiner

*Primary Examiner*—Craig E. Church
(74) *Attorney, Agent, or Firm*—Daryl S. Grzybicki; Christopher J. Horgan

(57) ABSTRACT

Optical systems compatible with extreme ultraviolet radiation comprising four reflective elements for projecting a mask image onto a substrate are described. The four optical elements comprise, in order from object to image, convex, concave, convex and concave mirrors. The optical systems are particularly suited for step and scan lithography methods. The invention enables the use of larger slit dimensions associated with ring field scanning optics, improves wafer throughput, and allows higher semiconductor device density. The inventive optical systems are characterized by reduced dynamic distortion because the static distortion is balanced across the slit width.

18 Claims, 6 Drawing Sheets

REFLECTIVE OPTICAL IMAGING SYSTEMS WITH BALANCED DISTORTION

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

1. Field of the Invention

This invention is related to an optical system for use with short wavelength radiation in photolithography equipment used in the manufacture of semiconductor devices.

2. Background of the Invention

Photolithography is a well known manufacturing process used to create devices upon substrates. The process typically involves exposing a patterned mask to collimated radiation, producing patterned radiation, which is passed through an optical reduction system. The reduced patterned radiation or mask image is projected onto a substrate coated with photoresist. Radiation exposure changes the properties of the photoresist allowing subsequent processing.

Photolithography machines, or "steppers", use two common methods of projecting a mask image onto a substrate: "step and repeat" and "step and scan". The step and repeat method sequentially exposes portions of a substrate to a mask image. The step and repeat optical system has a projection field which is large enough to project the entire mask image onto the substrate. After each image exposure, the substrate is repositioned and the process is repeated.

In contrast, the step and scan method scans a mask image onto a substrate through a slit. Referring to FIG. 1, a ring field lithography system 100 for use in the step and scan method is shown. A moving mask 101 is illuminated by a radiation beam 103, which reflects off the mask 101 and is directed through a reduction ring field optical system 107. Within the optical system 107, the image is inverted and the arcuate shaped ring field 109 is projected onto a moving substrate 111. The arcuate slit shaped reduced image beam 109 can only project a portion of the mask 101, thus the image beam 109 must scan the complete mask 101 onto the substrate 111. Because the mask 101 and substrate 111 move synchronously, a sharp image is scanned onto the substrate 111. Once the complete mask 101 is scanned onto the substrate, the mask 101 and substrate 111 are repositioned and the process is repeated. The dimensions of the slit are typically described by a ring field radius and a ring field width.

As manufacturing methods improve, the minimum resolution dimension which can be achieved with reduced pattern radiation decreases allowing more electronic components to be fabricated within a given area of a substrate. The number of devices that can be fabricated within an area of substrate is known as device density. A common measure of device density is the amount of memory that can be fabricated on a single DRAM chip. As resolution dimension decreases, DRAM memory size increases dramatically. With existing technology, 0.25 $\mu$m resolution is possible.

One well-known means of improving the resolution dimension and increasing device density is to use shorter exposure wavelength radiation during photolithography processes. The relationship between resolution dimension and radiation wavelength is described in the formula: $R=(K_1\lambda)/(NA)$, wherein R is the resolution dimension, $K_1$ is a process dependent constant (typically 0.7), $\lambda$ is the wavelength of the radiation, and NA is the numerical aperture of the optical system projecting the mask image. Either reducing the wavelength or increasing the NA will improve the resolution of the system.

Improving the resolution by increasing the numerical aperture (NA) has several drawbacks. The most prevalent drawback is the concomitant loss in depth of focus with increased NA. The relationship between NA and depth of focus is described in the formula: $DOF=(K_2\lambda)/NA^2$, wherein DOF is depth of focus, and $K_2$ is a process dependent constant (typically close to unity). This simple relationship shows the inverse relationship between DOF and NA. For several reasons, including practical wafer flatness and scanning stage errors, a large depth of focus is on the order of $\pm 1.0$ micrometers is desirable.

Immediately, the shortcomings of resolution improvement via numerical aperture increase can be seen. As lithography technologies evolve toward shorter wavelengths, projection systems operate in different regions of wavelength-NA space. For EUV lithography at an operational wavelength of 13.4 nm, 0.1 $\mu$m resolution can be achieved with a projection system that has a numerical aperture of 0.10. This low numerical aperture affords a depth of focus of $\pm 1$ $\mu$m. In stark contrast, deep ultraviolet (DUV) lithography at 193 nm requires a projection system with a numerical aperture of 0.75 to achieve 0.18 $\mu$m features (assuming $K_1=0.7$). At this NA, the depth of focus has been reduced to $\pm 0.34$ $\mu$m. This loss in depth of focus leads to a loss in the available process latitude, requiring tighter process control. As the process latitude shrinks, it becomes more difficult to maintain critical dimension (CD) control that is essential to the lithographic process.

As is known in the art, short X radiation (less than about 193 nm) is not compatible with many refractive lens materials due to the intrinsic bulk absorption. To reduce the radiation absorption within an optical system, reflective elements may be used in place of refractive optical elements. State of the art DUV systems use catadioptric optical systems which comprise refractive lenses and mirrors. The mirrors provide the bulk of the optical power and the lenses are used as correctors to reduce the field dependent aberrations.

To produce devices with smaller critical dimensions and higher device density than is possible with DUV systems, optical systems compatible with even shorter wavelength radiation are required. Extreme ultraviolet (EUV) radiation ($\lambda$ less than about 15 nm) cannot be focused refractively. However, EUV radiation can be focused reflectively using optical elements with multilayer coatings.

Early EUV lithographic projection optical systems focused on the development of optical systems that project two dimensional image formats. One example of a step and repeat optical system is disclosed in U.S. Pat. No. 5,063,586. The '586 patent discloses coaxial and tilted/decentered configurations with aspheric mirrors which project approximately a 10 mm×10 mm image field. The '586 patent system achieves an acceptable resolution of approximately 0.25 $\mu$m across the field, but suffers from unacceptably high distortion, on the order of 0.8 $\mu$m. The '586 patent optical system is impractical because the mask would have to pre-distorted in order to compensate for the distortion.

More advanced step and scan optical systems have been developed due to the unacceptable distortion of the large image fields of step and repeat optical systems. Step and scan systems have inherently less distortion than step and repeat systems due to the reduced field size. The distortion can be readily corrected over the narrow slit width in the direction of scan. Step and scan optical systems typically utilize ring fields. Referring to FIG. 2, in a step and scan optical system an image is projected by the optical system onto the wafer through an arcuate ring field slit 201, which is geometrically described by a ring field radius 203, a ring field width 205 and a length 207. Ring field coverage is limited to 180° in azimuth.

One example of a step and scan optical system is disclosed in U.S. Pat. No. 5,315,629. Although the '629 patent optical system has low distortion, the ring field slit width is only 0.5 mm at the wafer. High chief ray angles at mirror M1 make it difficult to widen the ring field width. The 0.5 mm width of the '629 patent limits the speed at which the wafer can be scanned, restricting throughput.

Another disadvantage of systems similar to the '629 patent optical system is that it may require the use of graded multilayer coatings on the reflective optics, as opposed to simpler multilayer coatings that have a uniform thickness across the mirror substrate. Uniform thickness multilayer coatings are generally not suitable for high incidence angles when a wide range of incidence angles across an optic are present. FIG. 3 illustrates the potential for non-uniform reflectivity resulting from high and wide ranges of incidence angles from a uniform multilayer optical element 305. In this instance, Beams 301 and 303 have incident angles of 10° and 15°, which correspond to multilayer reflectivities of 69% and 40%, respectively. The intensity of reflected beam 309 is less than the intensity of reflected beam 311 because the incidence angle of beam 303 lies in a lower reflectivity region than the incidence angle of beam 301. This difference in the resulting reflectivity creates an apodization in the exit pupil of the imaging system that leads to a loss in line width control in the projected image.

Referring again to FIG. 3, if a graded reflective coating is properly applied to optical element 305, the reflectivity at the incidence point of beam 303 is increased so that the reflected beam 309 has an intensity equal to that of beam 311. Although graded reflective optics can address the intensity apodization problem, graded reflective optics are nonetheless undesirable because they are difficult to fabricate and test.

Another example of a step and scan optical system is U.S. Pat. No. 5,353,322. The '322 patent discloses 3-mirror and 4-mirror optical systems for EUV projection lithography. An extra fold mirror added to the 3-mirror embodiment creates a 4-mirror system that solves the wafer/mask clearance problem presented by a system with an odd number of reflections. However, this mirror does not provide any reflective power and thus provides no aberration correction. Another drawback of the '322 optical system is that its aperture stop is physically inaccessible. Because these systems have no physically accessible hard aperture stop to define the imaging bundle from each field point in a like manner, the projected imagery could vary substantially across the ring field as the different hard apertures in the system vignette or clip the imaging bundles. This vignetting or clipping can lead to loss of critical dimension (CD) control in the projected image at the wafer.

There are a number of other prior art optical systems compatible with EUV wavelength radiation that use reflective optics. These prior art EUV optical systems typically use simple reflective optics which have spherical convex or spherical concave surfaces. The surface of a spherical reflective element is defined by a constant radius of curvature across the surface of the optic. A drawback of all spherical systems is that they can distort projected images by introducing unwanted aberrations (i.e. spherical, coma, astigmatism, Petzval curvature and distortion). These aberrations can be at least partially corrected or even eliminated by using aspheric mirrors.

Many prior art EUV optical systems have been designed to minimize static distortion. The disadvantage of optical systems with minimized static distortion is that the dynamic or scanned distortion may not be minimized. Dynamic or scanned distortion is the actual distortion of a projected image in a scanning lithography system and is substantially different than static distortion.

In view of the foregoing, there is a need for high resolution optical systems that are compatible with short wavelength radiation, have high numerical apertures, high radiation throughput, use uniform thickness multilayer reflective coating optics, do not require highly aspheric reflective optics, have an accessible aperture stop, and have low dynamic distortion.

SUMMARY OF THE INVENTION

The present invention is directed to 4-mirror reflective optical systems that have high resolution, high numerical aperture, and balanced distortion. The present invention allows higher device density because resolution is increased. The reflective optics have been configured to improve radiation throughput by improving optical element reflectivity. The optical elements have been configured with radiation beam incidence angles as close as possible to perpendicular. The acceptable ranges of incidence angles have also been minimized to preserve uniform reflectivity and to eliminate the need for graded multilayer optics, which can add significant risk to the system. The inventive optical systems further minimize manufacturing risks by not requiring highly aspheric optical elements. The present invention includes an accessible aperture stop.

The present invention also has a balanced centroid distortion curve across the ring field width. More specifically, the centroid distortion levels at the edges of the ring field width are substantially equal and quantitatively higher than the centroid distortion at the center of the ring field width. By balancing the static centroid distortion curve across the ring field width, the dynamic distortion is minimized.

Other advantages and features of the present invention will become apparent from a reading of the following description when considered in conjunction with the accompanying drawings.

DESCRIPTION OF THE PREFERRED EMBODIMENT

Figure 1:
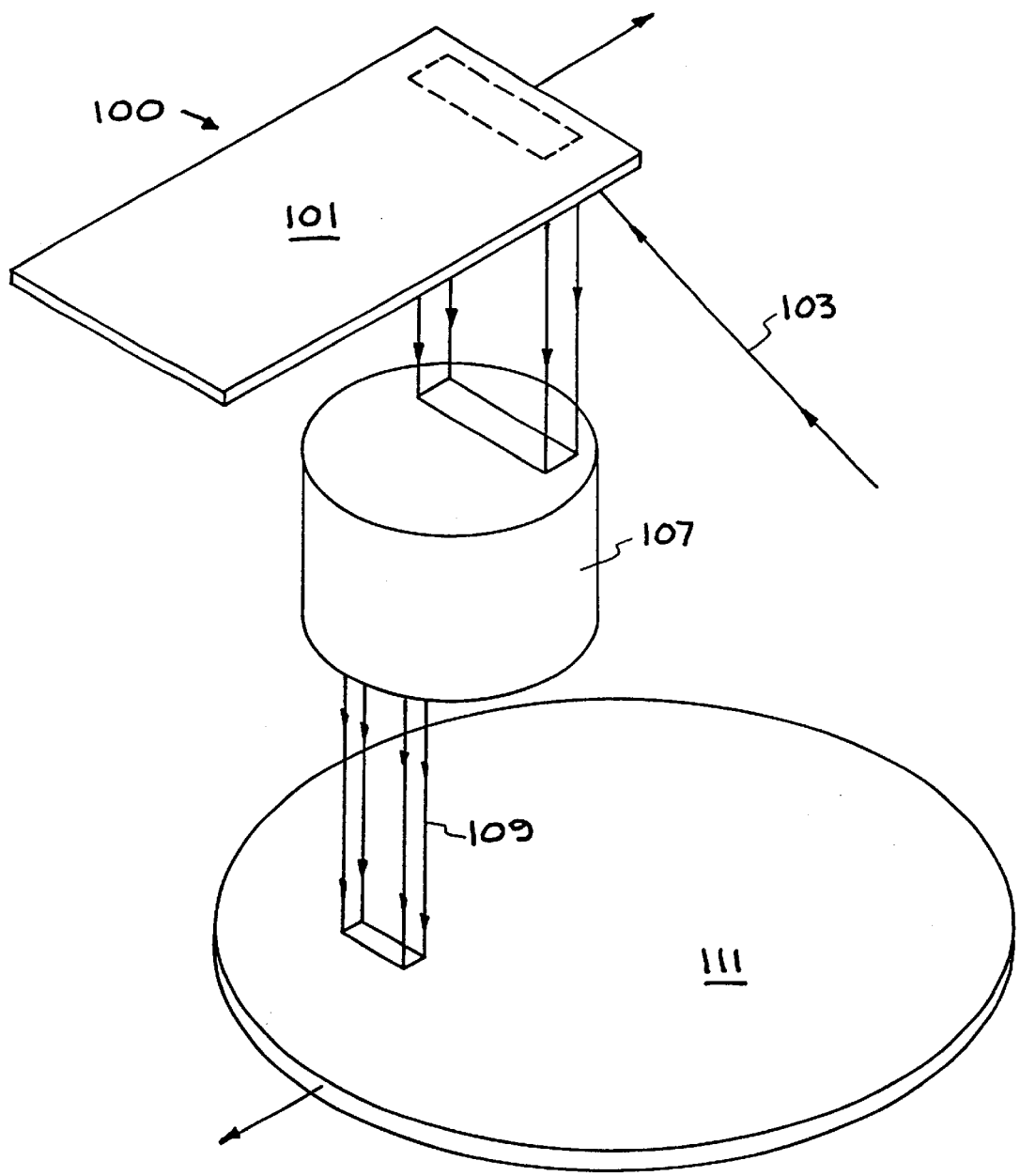
FIG. 1 is a view of a prior art ring field lithography system.

The following is a detailed description of the presently preferred embodiments of the present invention. However, the present invention is in no way intended to be limited to the embodiments discussed below or shown in the drawings. Rather, the description and the drawings are merely illustrative of the presently preferred embodiments of the invention.

Figure 4:
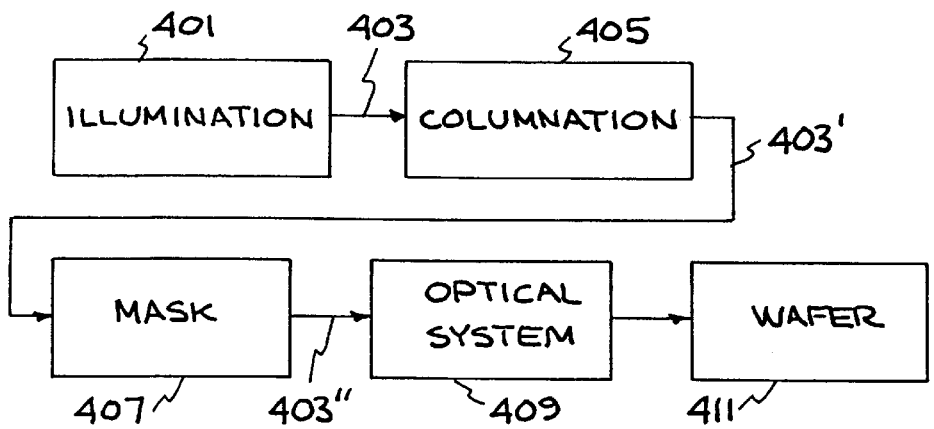
FIG. 4 is a schematic depiction of the main elements of the exemplary EUV lithography apparatus according to the present invention.

The present invention is a photolithography optical system designed for use with extreme ultraviolet (EUV) radiation. FIG. 4 schematically depicts the exemplary inventive apparatus for semiconductor EUV lithography. The apparatus comprises a radiation source 401 that emits EUV radiation 403. The EUV radiation 403 is processed by a condenser 405 which produces a EUV beam 407 to uniformly illuminate a portion of mask 409. The radiation reflected from the mask 409 produces a patterned EUV beam 411, which is introduced into optical system 413. The optical system 413 projects a reduced image 415 of the mask 409 onto a wafer 417.

EUV radiation has a wavelength λ between about 4 to 20 nm and may be produced by any suitable means, including laser produced plasma, synchrotron radiation, electric discharge sources, high-harmonic generation with femtosecond laser pulses, discharge-pumped x-ray lasers and electron-beam driven radiation devices. Laser-produced plasma (LPP) sources focus an intense pulsed laser beam onto a target. Suitable targets are metals and noble gases. Targets of noble gas molecule clusters in a supersonic jet produce a bright "spark" with a broad emission spectrum from the visible to the EUV radiation. High-repetition-rate (3,000–6,000 Hz) pulsed laser drivers deliver 1,500 W of focused power to the target regions. The LPP gas source then converts the incident laser power into EUV light in the required spectral bandwidth.

The condenser collects EUV power from the LPP source and conditions the radiation to uniformly illuminate the mask. The condenser provides the EUV radiation in a narrow ring field with at least 1% uniformity at the mask in the cross scan dimension. The condenser further directs the EUV beam into the entrance pupil of the inventive optical system with a partial coherence of approximately 0.7. Separate collection channels each act in parallel, directing radiation across the entire ring field and the optical system entrance pupil.

Since EUV radiation is absorbed by all materials, only reflective elements are suitable for EUV optical systems. The inventive optical system comprises four reflective optical elements (mirrors) listed in order from mask to substrate: M1, M2, M3 and M4. The optical system is placed in a vacuum or other suitable atmosphere.

Figure 5:
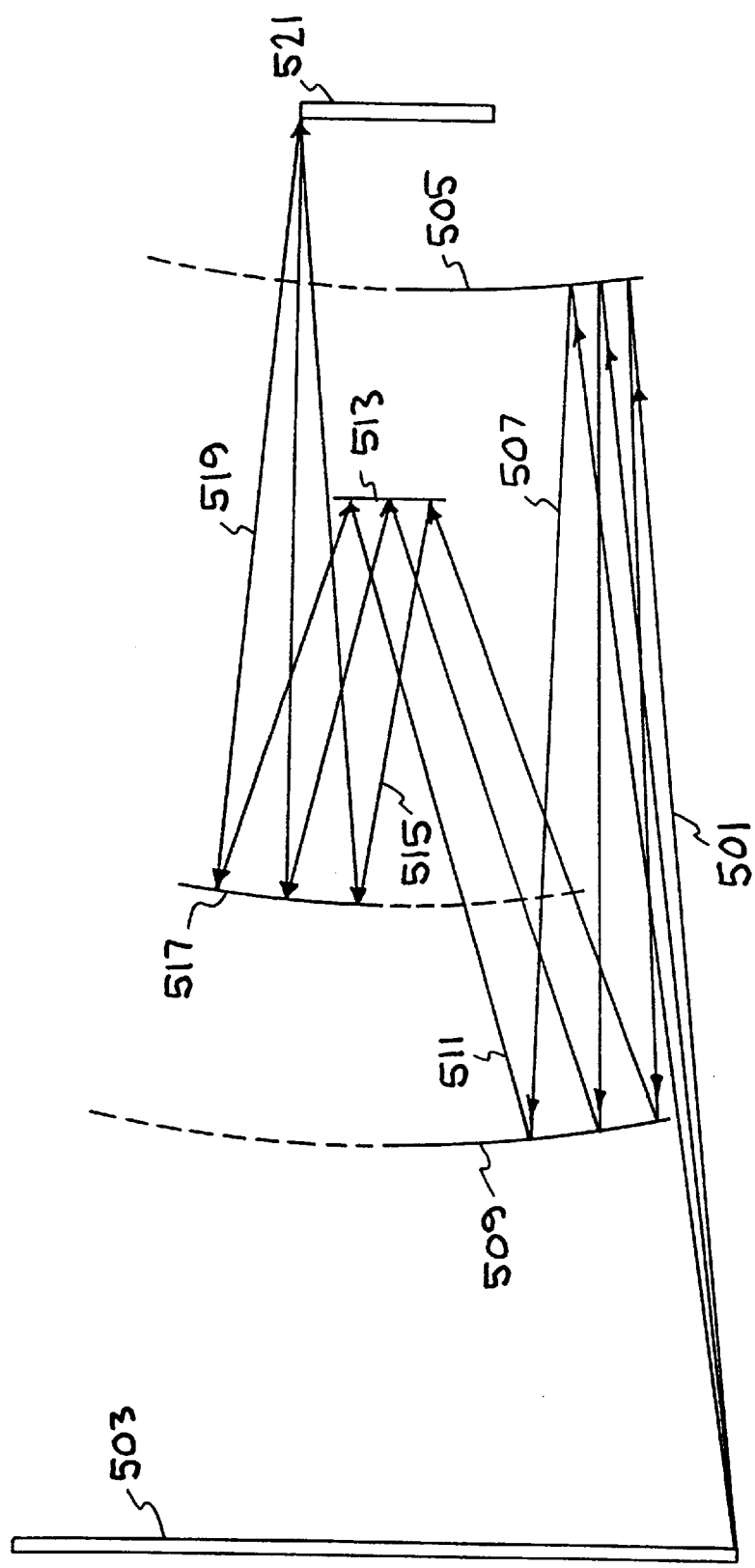
FIG. 5 is a view of one embodiment of the optical system according to the present invention.

During lithography, EUV rays are collimated and directed at a mask, producing patterned radiation. The object end of the inventive optical system departs enough from telecentricity so that a reflective mask can be used without any vignetting of the light rays by mirror edges. Referring to FIG. 5, an exemplary optical system is shown for EUV semiconductor lithography. Because this is a ring field optical configuration, the lower section of the first optical element M1 505, the lower section of the second optical element M2 509, all of the third optical element M3 513, and the upper section of the fourth optical element M4 517 are exposed to EUV radiation. The optical elements are all arranged in a coaxial configuration. The portions of the mirrors actually used are designated with solid lines, and the sections of the parent mirror that are not used are designated with dotted lines.

An EUV Beam 1 501 diverges from a reflective mask 503 onto convex aspheric mirror M1 505. Beam 2 507 is reflected from mirror M1 505 in a divergent cone to a concave aspheric mirror M2 509. Beam 3 511 is reflected from mirror M2 509 in a convergent cone to a convex spherical mirror M3 513, which also functions as an aperture stop. Beam 4 515 is reflected from mirror M3 513 in a divergent cone to a concave aspheric mirror M4 517. Beam 5 519 is reflected from mirror M4 517 in a convergent cone, projecting a reduced image of the mask 503 pattern onto a wafer 521. The chemical reaction of a photoresist layer on the wafer 521 to the patterned EUV exposure enables subsequent semiconductor processing by well-known means.

Concave mirrors have positive optical power and convex mirrors have negative optical power. Using this convention, the optical power configuration of the first embodiment of the inventive system from object to image can be described as: negative, positive, negative and positive, corresponding to mirrors M1 505, M2 509, M3 513, and M4 517, respectively. This inventive placement of optical power allows the projection system to produce a reduction ratio of 4× and a telecentric imaging bundle at the wafer that is normal to the wafer (substrate plane), while simultaneously providing the necessary opto-mechanical clearances and achieving a near-zero Petzval sum (flat field condition). The numerical aperture of the system is about 0.1. The absolute radii of the mirrors M1 505, M2 509, M3 513, and M4 517, relative to the system focal length, are listed in Table 1.

TABLE 1

| Mirror | Mirror radii from object plane to image plane as a fraction of the system focal length ±5% |
| --- | --- |
| M1 | 5.471 |
| M2 | 1.984 |
| M3 | 0.711 |
| M4 | 0.924 |

The axial separations of the mirrors M1 505, M2 509, M3 513 and M4 517, relative to the system focal length, are listed in Table 2. For a 4-to-1 reduction, the distance of the mask to M1 305 is 1005.654 mm.

TABLE 2

| Surface | Axial separations of the mirrors as a fraction of the system focal length ±10% |
| --- | --- |
| M1 to M2 | 1.119 |
| M2 to M3 | 0.897 |
| M3 to M4 | 0.459 |
| M4 to image | 0.826 |

Figure 2:
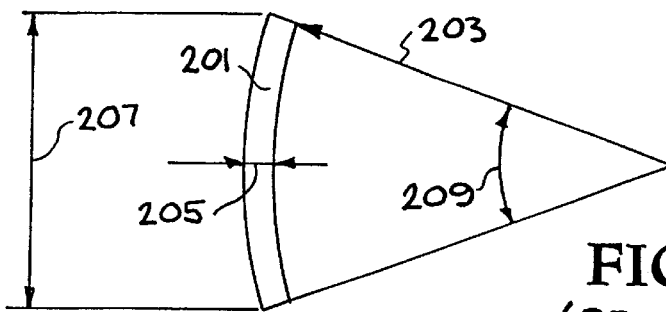
FIG. 2 is a view of a ring field slit.
Figure 3:
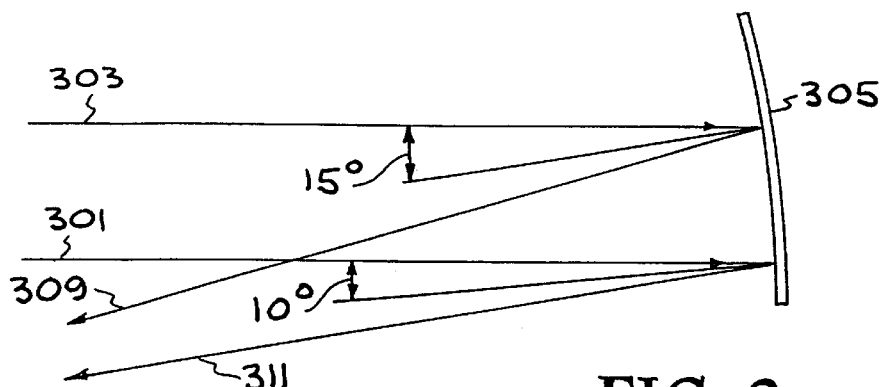
FIG. 3 is a view of two radiation beams incident upon a reflective element.

The inventive optical system projects a mask image onto a wafer through the step and scan method. Referring to FIG. 2, the usable field projected by the inventive optical system is in the form of an arcuate slit 201. The inventive optical system can be configured with length 207 of 26 mm at an angle 209 of approximately 30°, a ring field width 205 of 1.5 mm and a ring field radius 203 of 52.75 mm. The inventive system achieves a resolution of 0.1 μm or better with a depth of focus greater than 1 μm across the projected image field.

The inventive optical system arcuate slit dimensions are an improvement over the prior art. The prior art typically produced an arcuate slit with a length of approximately 16 mm at an angle of approximately 60°, a ring field width of approximately 0.5 mm to 1.0 mm, and a ring field radius of approximately 31.5 mm. The ring field width of the present invention (1.5–3.0 mm) is significantly wider than that of the prior art. Because the ring field radius of the present invention is larger than that of the prior art, the present invention improves the unit area coverage within a single field on the wafer, thereby improving wafer throughput per hour.

Tables 3–6 contain constructional data and other relevant information for the inventive optical system shown in FIG. 5. The inventive optical system is a telecentric ring field system with a slit width of 1.5–3.0 mm, a 4:1 reduction ratio, and a numerical aperture (NA) of at least 0.1. The reference wavelength is 13.4 mm.

Table 3 shows the mirror radii and spacings, and taken with Table 4 and Table 5, completely describes the apparatus of the example. Table 4 lists the aspheric constants. Table 6 shows the performance of the system as described by the root mean square (RMS) wavefront error and corresponding Strehl ratio.

TABLE 3

| Element number | Radius of Curvature | Thickness |
| --- | --- | --- |
| Object | Infinite | 1005.654000 |
| 1 | 2985.14000 | −610.424000 |
| 2 | 1082.16000 | 489.255000 |
| 3 | 388.09000 | −250.491500 |
| 4 | 504.16000 | 450.481604 |
| Image | Infinite | |

Dimensions are given in mm. Positive radius indicates center of curvature to the right. Thickness is axial distance to next surface.

TABLE 4

| Mirror | CURV | K | A | B | C | D |
| --- | --- | --- | --- | --- | --- | --- |
| M1 | 0.00033499 | −30.1000 | 0.0 | −3.10082E−16 | −3.97717E−21 | 0.0 |
| M2 | 0.00092408 | −0.80000 | 0.0 | −9.57030E−17 | −6.27533E−22 | 0.0 |
| M3 | 0.00257672 | 0.0 | 0.0 | 0.0 | 0.0 | 0.0 |
| M4 | 0.00198350 | 0.11828 | 0.0 | 1.64273E−16 | −2.25401E−21 | 0.0 |

TABLE 5

| | |
| --- | --- |
| Center of ring field (mask) | −211.0 mm |
| Effective focal length | 545.592 mm |
| Paraxial reduction ratio | 0.25 |
| Finite F/N$_O$ | 5.0 |
| Total track | 1084.475 mm |

TABLE 6

| Ringfield Radius | rms wavefront error (l = 13.4 nm) | Strehl ratio |
| --- | --- | --- |
| 52.00 mm | 0.020λ | 0.984 |
| 52.25 mm | 0.013λ | 0.993 |

TABLE 6-continued

| Ringfield Radius | rms wavefront error (l = 13.4 nm) | Strehl ratio |
| --- | --- | --- |
| 52.50 mm | 0.008λ | 0.998 |
| 52.75 mm | 0.005λ | 0.999 |
| 53.00 mm | 0.009λ | 0.997 |
| 53.25 mm | 0.015λ | 0.991 |
| 53.50 mm | 0.021λ | 0.982 |

The aspheric profile is uniquely determined by its K, A, B, C, and D values, such as given in Table 4. The sag of the aspheric surface (through 10th order) parallel to the z-axis (z) is given by Equation 1:

$$z = \frac{ch^2}{1+\sqrt{1-(1+k)c^2 h^2}} + Ah^4 + Bh^6 + Ch^8 + Dh^{10} \quad [1]$$

Wherein, h is the radial coordinate; c is the curvature of the surface (1/R); and A, B, C, and D are the 4th, 6th, 8th, and 10th order deformation coefficients, respectively. The equation coefficients A and D are zero for the mirrors M1, M2, and M4, thus they use only 6th and 8th order polynomial deformations. The optical elements M1, M2, M3, and M4 can be described via the base conic as a hyperboloid, prolate ellipse, sphere, and oblate spheroid, respectively.

Figure 6:
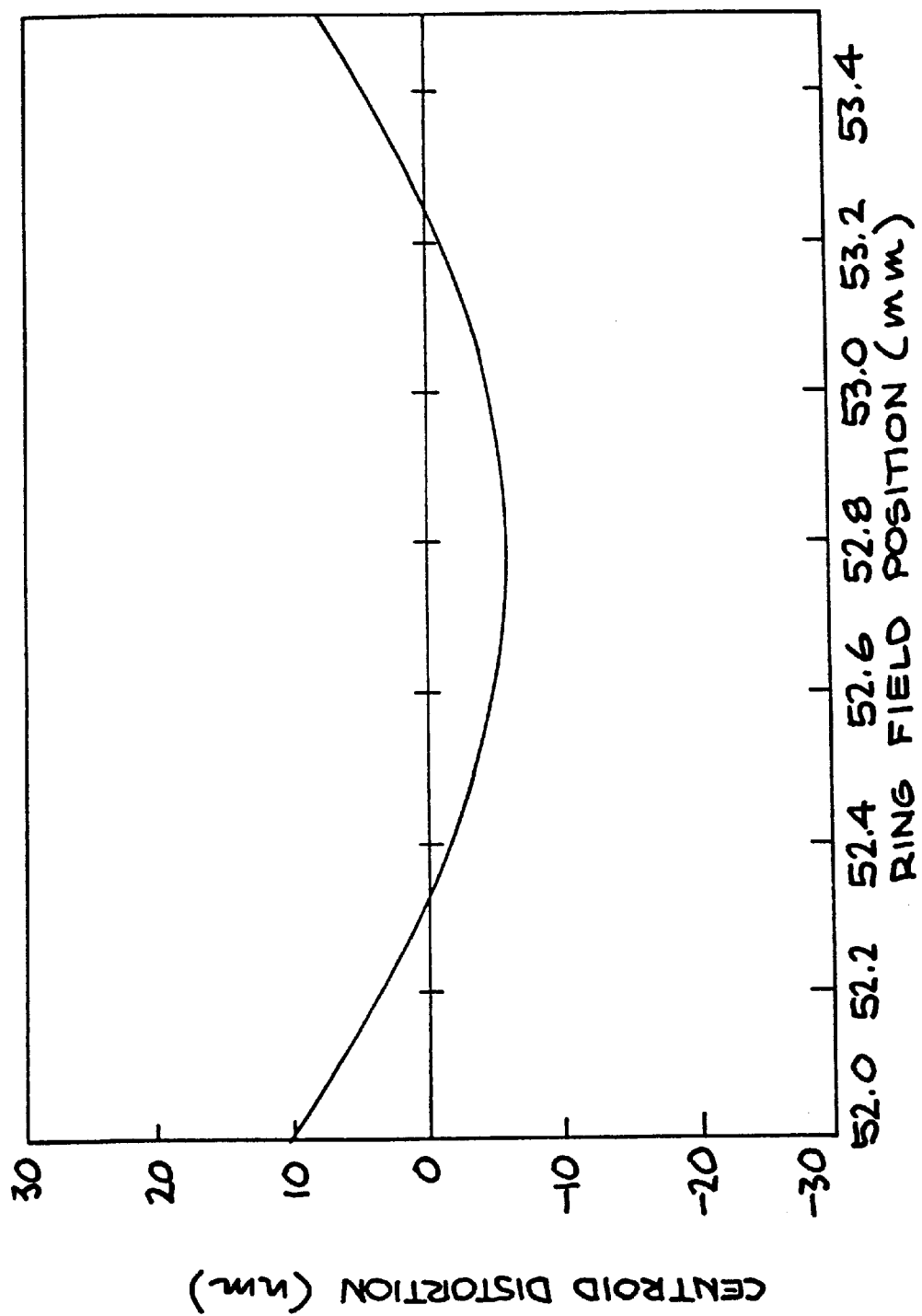
FIG. 6 is a graph showing distortion v. position across the ring field width for one embodiment of the optical system.

Another advantage of this first embodiment of the present invention is that the centroid distortion magnitude is balanced across the ring field width. This balance distortion curve results in a minimization of dynamic (scanning) distortion. Referring to FIG. 6, the centroid distortion curve of the inventive optical system is shown. The centroid location is the geometric center of an arcuate radiation ray imaged from a point on the mask to the wafer (substrate). The distortion curve is balanced when the shape of the centroid distortion curve is quadratic across the ring field width, and the point of inflection of the curve is located substantially at the center of the ring field width. The shape of the curve may be either "U" or "∩", depending on how the input field was defined at the mask, and with the magnitude of distortion substantially equal at the edges of the ring field width.

In an optical system where static distortion is balanced, the path of the projected image (on the moving wafer) folds back on itself, causing the image blur to be minimized. When static distortion is not balanced, then the blurring becomes elongated. This could, in principle, be corrected by scanning the wafer at a slightly different velocity. However, if this is done, the location of the printed image will be incorrect and a straight line will be printed as curved. By balancing the centroid distortion across the ring field width, dynamic distortion and image smearing are reduced and the ring field width can be increased.

The balanced static centroid distortion curve of the present invention is obtained by adjusting the asphericity of optical elements M1, M2, and M4. The distortion in an optical system can be expanded in a power series of odd terms, with the 3rd and 5th order terms being the lowest ones. The 3rd and the 5th order static distortions can be adjusted so that the centroid distortion is symmetrically balanced across the ring field width. These aspheric surfaces on M1, M2, and M4 also help correct astigmatism across the ring. The aspheric surfaces can also be expanded as a departure from a base sphere as a function of aperture radius in a power series of even terms. The expansion of the distortion and the aspheric surfaces are interrelated in that the 4th and 6th order aspheric terms influence the 3rd and 5th order distortion terms. By adjusting the aspheric terms, the magnitude and sign (+or −) of the 3rd and 5th order distortion terms can be controlled. The prior art systems adjusted the aspherics terms in order to minimize the overall distortion across the ring field slit width, but not to shape the distortion curve, thus the dynamic (scanning) distortions were never optimized.

Table 7 below shows the deviation (distortion) of the image centroid at the wafer from its ideal location.

TABLE 7

| Ideal Image Location (mm) | Centroid Distortion (nm) |
|---|---|
| 52.000 | 10.50 |
| 52.075 | 7.60 |
| 52.150 | 4.97 |
| 52.225 | 2.62 |
| 52.300 | 0.55 |
| 52.375 | −1.24 |
| 52.450 | −2.74 |
| 52.525 | −3.95 |
| 52.600 | −4.87 |
| 52.675 | −5.50 |
| 52.750 | −5.83 |
| 52.825 | −5.85 |
| 52.900 | −5.57 |
| 52.975 | −4.98 |
| 53.050 | −4.07 |
| 53.125 | −2.85 |
| 53.200 | −1.32 |
| 53.275 | 0.55 |
| 53.350 | 2.73 |
| 53.425 | 5.25 |
| 53.500 | 8.10 |

In scanning lithography, the mask and wafer are synchronously scanned so that the projected ring field at the mask will cover the entire wafer field. The scanning process has a substantial effect on the image aberrations, particularly distortion. The image distortion due to the relative movement of the image and the substrate during radiation exposure is dynamic distortion which can smear an image out along a field-dependent trajectory as the image crosses the ring field width.

Although some of the radiation incident to the optical elements is reflected, a large percentage of the incident radiation is absorbed. The total reflectivity of a four mirror optical system is described by the formula: $R_{total}=R_1 \times R_2 \times R_3 \times R_4$, where $R_x$ represents the reflectivity of Mirror$_x$. Different reflective coatings have different reflectivities. Reflective coatings, which have been found to have acceptable EUV reflectivity, include multilayer coatings of molybdenum/silicon (Mo/Si) and molybdenum/beryllium (Mo/Be). The maximum theoretical reflectivity of a multilayer mirror made of Mo/Si is approximately 72%. The Mo/Si multilayer structure includes an alternating layer stack of Mo and Si. The Mo and Si layers are deposited by a dc-magnetron sputtering system or an ion beam sputtering system. The thickness of each layer is determined by simultaneously maximizing the constructive interference of the beams reflected at each interface and minimizing the overall absorption to enable more interfaces to contribute to the reflectance.

In addition to being highly reflective, the optical elements must have extremely accurate surface figures and surface roughness. State-of-the-art techniques are used to fabricate mirror surface figures with an accuracy of about 0.25 nm rms or better. Interferometers are used to measure the dimensional accuracy of the figure of the aspheric mirrors and the wavefront of assembled projection. Commercially available tools are capable of measuring surface roughness.

Figure 7:
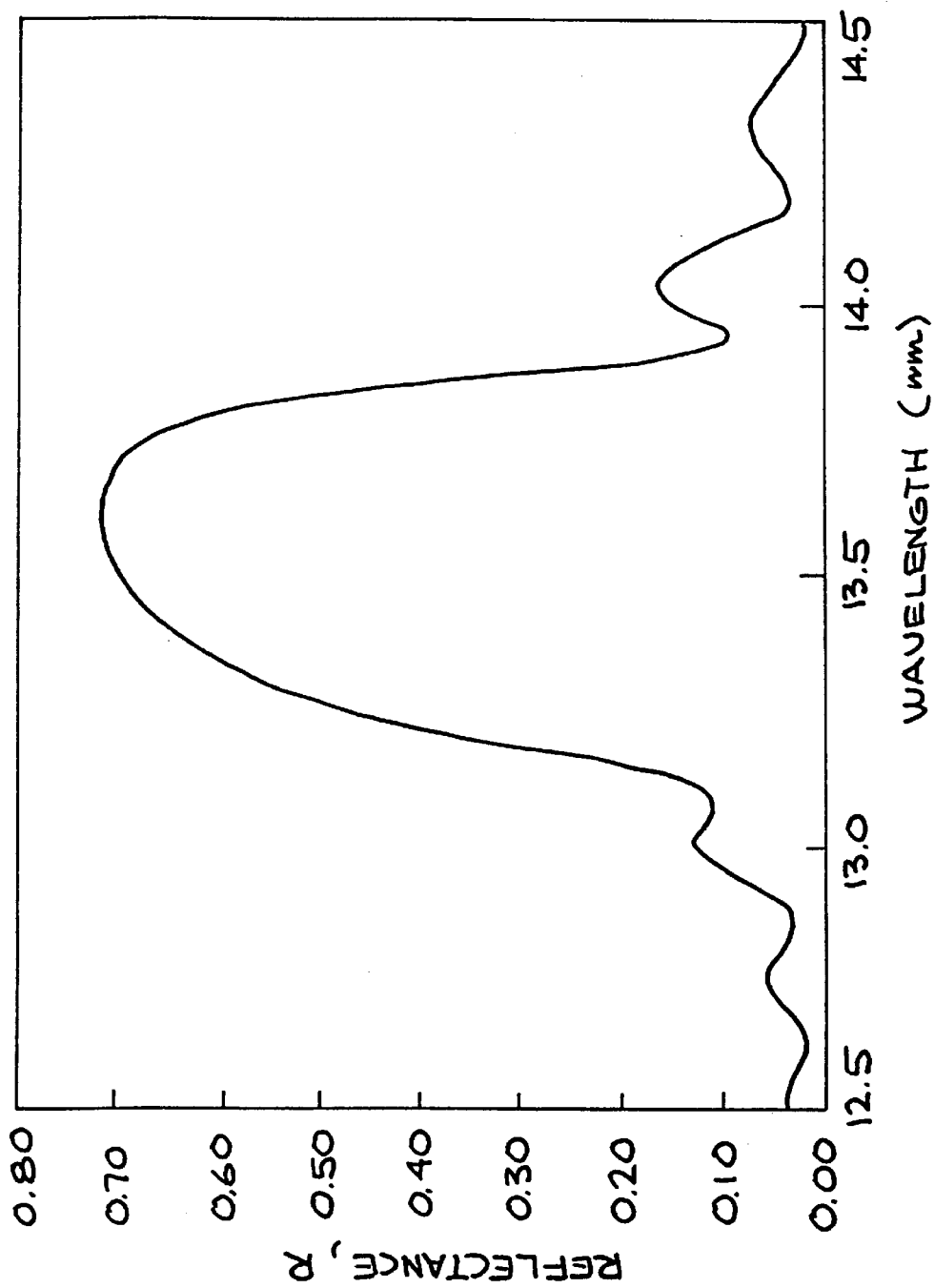
FIG. 7 is a graph showing reflectivity v. wavelength for a Mo/Si multilayer reflective coating.

Although suitable reflective surfaces exist for EUV radiation, the wavelength must be kept within a tight tolerance to maintain acceptable reflectivity. The described reflectivity varies with the wavelength of the radiation. Referring to FIG. 7, a plot of the theoretical reflectivity versus wavelength at normal incidence is shown for a 40 bilayer Mo/Si multilayer. The maximum theoretical reflectivity of approximately 72% is achieved when the radiation wavelength is 13.4 nm; however, a deviation of 0.4 nm in the radiation wavelength results in reflectivity of only 12%.

Shifts in radiation wavelength are equivalent to changes in the incidence angle, i.e., both result in reduced reflectivity. The inventive optical systems maintain a high overall system reflectivity by utilizing shallow incidence angles that are within the highly reflective region of the multilayer surface. The thickness of the layer coatings can be adjusted to maximize the reflectivity for a specific range of incidence angles.

The maximum theoretical reflectivity of over 70% for a suitably constructed Mo/Si multilayer optical element is obtained when the radiation incidence angle is 5°±5. At incidence angles of 12.5° and 15°, the reflectivity decreases to about 40% and 12%, respectively. Keeping the incidence angles low at M1, M2, and M4, maximizes the system reflectivity by ensuring that the multilayer is being used at its highest reflectivity at all times.

The maximum theoretical reflectivity of over 70% can be shifted to higher incidence angles at the expense of the angular bandwidth of the coating. The design of the Mo/Si multilayer is adjusted so the reflectance peak is shifted to about 12°±1, where the reflectivity of this multilayer coating decreases more rapidly as the incidence angle deviates from 12°. At incidence angles of 0° and 17°, the reflectivities decrease to approximately 55% and 40%, respectively. The reflectivity M3 is maximized by using reflective optics specifically designed for incidence angles between approximately 11° and 13°.

In Table 8, the mean angle of incidence, the angle of incidence range and the corresponding Mo/Si reflectivity are listed for the optical elements of the present invention.

TABLE 8

| Optical Element | Mean Angle of Incidence | Angle of Incidence Range | Reflectivity Range |
|---|---|---|---|
| M1 | 3.48° | 3.8° | 70–71% |
| M2 | 6.56° | 0.8° | 71% |
| M3 | 12.0° | 1.6° | 70% |
| M4 | 6.0° | 1.4° | 70.5–71% |

A benefit of the inventive optical system configuration is that the intensity of the illumination in the imaging bundle is uniform without the use of complex graded multilayer coatings. Prior art optical systems may require graded multilayer coatings to achieve this same level of illumination uniformity. In addition, in the present optical system the high radiation intensity and heat generation, which can degrade the reflective coating and cause thermal distortion of the optical element, is minimized. Because the inventive system has a high total reflectivity, the absorbed energy is minimized. The inventive system is also able to dissipate the absorbed energy more readily because mirror Ml has a large surface area. By spreading the radiation energy across a broader surface area, the radiation intensity and resulting heat generation are minimized.

The inventive optical system requires only low aspheric mirrors, which are significantly easier to fabricate and test than highly aspheric mirrors. Mirrors with asphericities less than approximately 12 micrometers (low asphericity) can be tested at the center of curvature without the need for complex auxiliary test optics. In addition, low asphericity mirrors are more easily polished to an excellent surface finish of less than 1 Å. Table 9 below shows the maximum aspheric departure from a best-fit spherical surface centered on the off-axis section of the parent asphere for each mirror. While the listed asphericities are for the preferred embodiment, these asphericities may vary by ±3.0 µm for M1, ±4.0 µm for M2, and ±3.0 µm for M4 for different projection systems. In addition, mirror M3 may also be aspheric, with a maximum departure of ±2.0 µm from the best fit sphere.

TABLE 9

| Mirror | Maximum Aspheric Departure |
| --- | --- |
| M1 | 6.2 µm |
| M2 | 9.6 µm |
| M3 | 0 |
| M4 | 2.7 µm |

Yet another advantage of the inventive optical system is that the design has an accessible, real aperture stop on mirror M3. The accessible aperture stop makes the projected imagery stationary. The imagery is independent of the position in the ring field. More specifically, the physically accessible aperture stop ensures that imaging bundles from each field point are not clipped or vignetted across the ring field width. M3 is configured with at least 5 mm of clearance around its diameter from other radiation beams making it accessible for adjustment.

Figure 8:
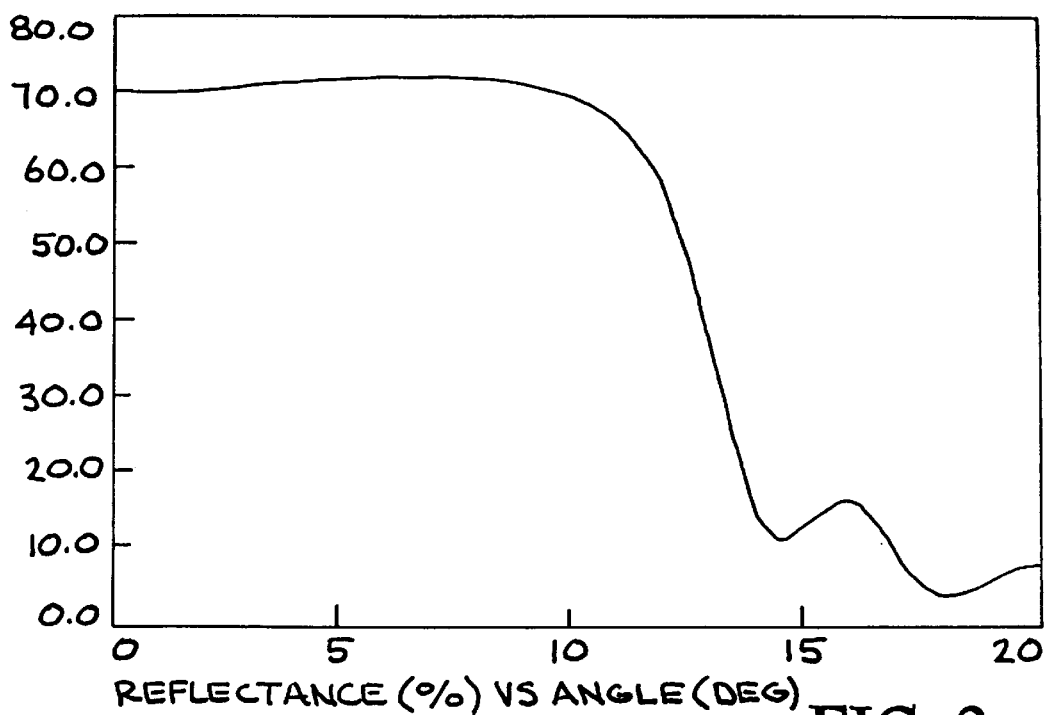
FIG. 8 is a view of another embodiment of the optical system according to the present invention.

FIG. 8 illustrates a second embodiment of the present invention. Modifications to the first embodiment of the present invention depicted in FIG. 5 enable larger numerical apertures, which allows increased resolution. By changing the distribution of optical power within the projection system, numerical apertures in excess of 0.10, and typically between 0.1 and 0.14, can be achieved.

Increasing the numerical aperture decreases the ray clearance around mirrors M1 and M3. Ray clearance can be improved substantially by increasing the field bias. However, the field dependent aberrations become more difficult to correct as the field bias is increased. In addition, incident angles at each mirror increases with increasing field bias. This necessarily complicates the multilayer coating task. A better approach to solving the ray clearance problem is to decrease the physical distance from the mask plane to mirror M1, while reducing the radius of the ring field at the mask to keep the field bias constant. In this manner, the incident angles at each of the mirrors can be constrained to acceptable limits.

The reduction ratio of the system decreases as the distance from the mask to M1 is decreased. To increase the reduction back to 4×, the negative power of mirror M1 is increased relative to the system focal length. The Petzval sum must be substantially zero to achieve high resolution imagery. This increase in the power of mirror M1 must be balanced against a decrease in the power of mirror M3 to maintain a well-corrected Petzval sum.

For this second embodiment shown in FIG. 8, the absolute radii of the mirrors M1 801, M2 803, M3 805, and M4 807, relative to the system focal length, are listed in Table 10.

TABLE 10

| Mirror | Mirror radii from object plane to image plane as a fraction of the system focal length ±5% |
| --- | --- |
| M1 | 4.297 |
| M2 | 2.411 |
| M3 | 0.867 |
| M4 | 1.036 |

The axial separations of the mirrors M1 801, M2 803, M3 805, and M4 807, relative to the system focal length, are listed in Table 11. For a 4-to-1 reduction, the distance of the mask to M1 801 is 726.688 mm.

TABLE 11

| Surface | Axial separations of the mirrors as a fraction of the system focal length ±10% |
| --- | --- |
| M1 to M2 | 1.488 |
| M2 to M3 | 1.251 |
| M3 to M4 | 0.514 |
| M4 to image | 0.902 |

Tables 12–15 contain constructional data and other relevant information for the inventive optical system shown in FIG. 8. The inventive optical system is a telecentric ring field system with a slit width of about 0.5–3.0 mm, a 4:1 reduction ratio, and a numerical aperture (NA) in the range of about 0.1 to 0.14. The reference wavelength is 13.4 mm.

Table 12 shows the mirror radii and spacings, and taken with Table 13 and Table 14, completely describes the apparatus of the example. Table 13 lists the aspheric constants. Table 15 shows the performance of the system as described by the root mean square (RMS) wavefront error and corresponding Strehl ratio.

The aspheric profile is uniquely determined by its K, A, B, C, and D values, such as given in Table 13. The sag of the aspheric surface (through 10th order) as a function of radial coordinate (h) given by Equation 1. Mirrors M1, M2, and M4, are base conics with 6th, 8th, and 10th order polynomial deformations. Mirror M3 has only a 6th order polynomial deformation. Identifying the mirror type via the base conic, the optical elements M1 and M2 are a hyperboloid and prolate ellipsoid, respectively. Both optical elements M3 and M4 are oblate spheroids.

TABLE 12

| Element number | Radius of Curvature | Thickness |
| --- | --- | --- |
| Object | INFINITY | 726.688000 |
| 1 | 1824.00000 | −631.705000 |
| 2 | 1023.60000 | 530.859078 |
| 3 | 368.17500 | −218.256865 |
| 4 | 439.83400 | 382.841399 |
| Image | INFINITY | 0.000000 |

Dimensions are given in mm. Positive radius indicates center of curvature to the right. Thickness is axial distance to next surface.

TABLE 13

| Mirror | CURV | K | A | B | C | D |
|---|---|---|---|---|---|---|
| M1 | 0.00054825 | −13.470700 | 0.0 | 9.015830E−16 | −5.054450E−20 | 3.951610E−25 |
| M2 | 0.00097694 | −0.517400 | 0.0 | −2.821200E−17 | −1.395030E−21 | 7.556670E−27 |
| M3 | 0.00271610 | 0.407900 | 0.0 | 4.389380E−15 | 0.000000E+00 | 0.000000E+00 |
| M4 | 0.00227359 | 0.155600 | 0.0 | 3.890150E−16 | −1.108150E−20 | 4.030120E−25 |

TABLE 14

| | |
|---|---|
| Center of ring field (mask) | −200.0 mm |
| Effective focal length | 424.519 mm |
| Paraxial reduction ratio | 0.25 |
| FiniteF/$N_o$ | 4.15 |
| Total track | 790.427 mm |

TABLE 15

| Ringfield Radius | rms wavefront error (l = 13.4 nm) | Strehl ratio |
|---|---|---|
| 52.00 mm | 0.028λ | 0.970 |
| 52.25 mm | 0.015λ | 0.991 |
| 52.50 mm | 0.009λ | 0.997 |
| 52.75 mm | 0.020λ | 0.985 |
| 53.00 mm | 0.0036λ | 0.951 |

This second embodiment also has an accessible, real aperture stop on mirror M3. More specifically, the accessible aperture stop ensures that imaging bundles from each field point within the ring field are not clipped or vignetted. This helps to ensure that the projected imagery, setting aside the effects of the field dependent aberrations and input illumination, is independent of position in the ring field. Such imagery is termed stationary.

Figure 9:
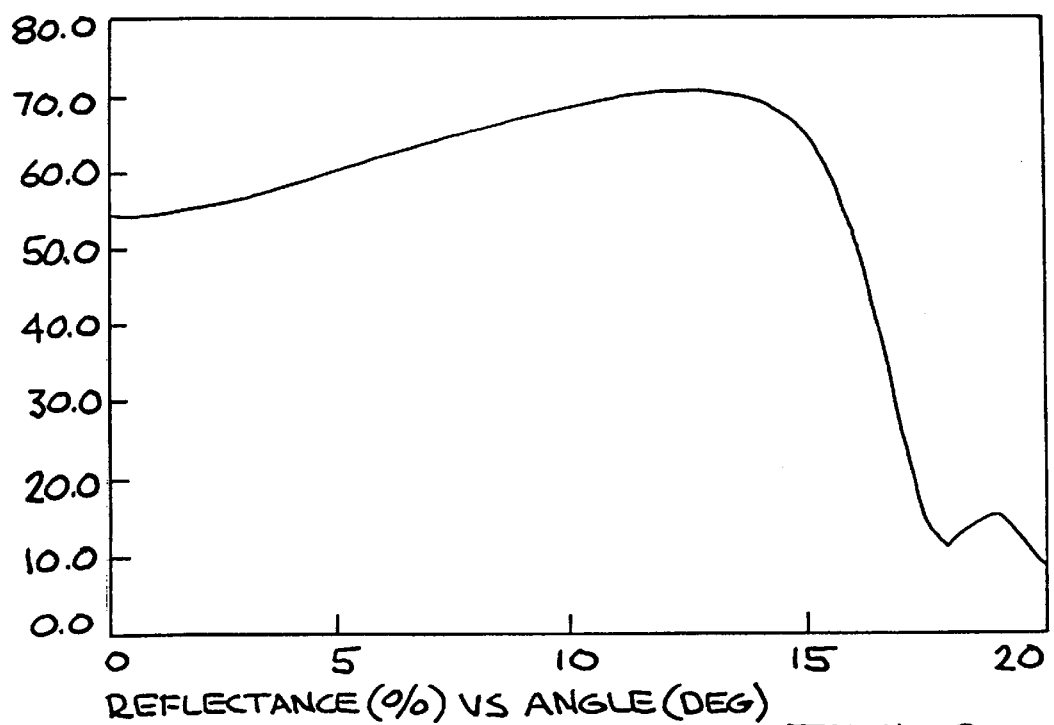
FIG. 9 is a graph showing the centroid distortion v. position across the ring field width for the embodiment shown in FIG. 8.

Another advantage of this second embodiment of the present invention is that the distortion is balanced across the width of the ring field. This balanced distortion curve results in a minimization of dynamic (scanning) distortion as explained previously. Referring to FIG. 9, the centroid distortion curve of this inventive optical system is shown. Table 16 below provides a tabular listing of the deviation of the image centroid its ideal location at the wafer plane. This deviation is the centroid distortion.

TABLE 16

| Ideal Image Location (mm) | Centroid Distortion (nm) |
|---|---|
| 49.500 | 11.69 |
| 49.550 | 9.39 |
| 49.600 | 7.32 |
| 49.650 | 5.48 |
| 49.700 | 3.87 |
| 49.750 | 2.49 |
| 49.800 | 1.35 |
| 49.850 | 0.45 |
| 49.900 | −0.22 |
| 49.950 | −0.64 |
| 50.000 | −0.82 |
| 50.050 | −0.75 |
| 50.100 | −0.43 |
| 50.150 | 0.13 |
| 50.200 | 0.95 |
| 50.250 | 2.02 |
| 50.300 | 3.35 |
| 50.350 | 4.94 |

TABLE 16-continued

| Ideal Image Location (mm) | Centroid Distortion (nm) |
|---|---|
| 50.400 | 6.79 |
| 50.450 | 8.91 |
| 50.500 | 11.29 |

This second embodiment of the present invention also requires only low aspheric mirrors. Table 17 below shows the maximum aspheric departure from a best-fit spherical surface centered on the off-axis section of the parent asphere for each mirror. While the listed asphericities are for the preferred embodiment, these asphericities may vary by ±2.0 $\mu$m for M1, ±2.0 $\mu$m for M2, ±1.0 $\mu$m for M3, and ±2.0 $\mu$m for M4 for different projection systems.

TABLE 17

| Mirror | Maximum Aspheric Departure |
|---|---|
| M1 | 8.80 $\mu$m |
| M2 | 11.70 $\mu$m |
| M3 | 0.16 $\mu$m |
| M4 | 4.70 $\mu$m |

While the present invention has been described in terms of the preferred embodiments above, those skilled in the art will readily appreciate that numerous modifications, substitutions and additions may be made to the disclosed embodiment without departing from the spirit and scope of the present invention. For example, although optical systems shown in FIGS. 5 and 8 have been described for use with a semiconductor photolithography system, those skilled in the art will readily appreciate that the inventive optical systems may be utilized in any similar lithography device and that the present invention is in no way limited to the mechanisms described above. It is intended that all such modifications, substitutions and additions fall within the scope of the present invention, which is best defined by the claims below.

What is claimed is:

1. A scanning ring field lithography apparatus for patterning images on a substrate comprising:

a radiation source emitting extreme ultraviolet radiation of wavelengths ranging from approximately 4 to 20 nanometers;

a reflective mask for generating patterned images at the substrate;

reflective focusing optics positioned between the mask and the substrate, comprising four reflective elements which listed from mask to substrate are characterized as convex, concave, convex and concave, arranged such that the convex first reflective element is positioned in closer proximity to the substrate than the convex third reflective element, wherein the reflective focusing optics project a focused image on and telecentric at the substrate in the shape of an arcuate slit having a width between approximately 0.5–3.0 mm, and wherein the reflective focusing optics are characterized by a balanced static centroid distortion curve across the width of the arcuate slit and a numerical aperture of at least about 0.1.

2. The apparatus of claim 1, wherein at least three of the four reflective elements of the reflective focusing optics are rotationally symmetric aspheric surfaces.

3. The apparatus of claim 1, wherein the first reflective element deviates from the best fitting spherical surface by 8.8 μm±2.0 μm, the second reflective element deviates from the best fitting spherical surface by 11.7 μm±2.0 μm, and the fourth reflective element deviates from the best fitting spherical surface by 4.7 μm±2.0 μm.

4. The apparatus of claim 1, wherein the four reflective elements of the reflective focusing optics are rotationally symmetric aspheric surfaces.

5. The apparatus of claim 4, wherein the first reflective element deviates from the best fitting spherical surface by 8.8 μm±2.0 μm, the second reflective element deviates from the best fitting spherical surface by 11.7 μm±2.0 μm, the third reflective element deviates from the best fitting spherical surface by 0.16 μm±1.0 μm, and the fourth reflective element deviates from the best fitting spherical surface by 4.7 μm±2.0 μm.

6. The apparatus of claim 1, wherein each optical element of the reflective focusing optics has a reflective multilayer coating in which each layer has a substantially uniform thickness.

7. The apparatus of claim 1, wherein the reflective focusing optics are positioned such that a beam of the extreme ultraviolet radiation has a mean incidence angle upon the first reflective element of about 3.5°±10°, a mean incidence angle upon the second reflective element of about 6.6°±10°, a mean incidence angle upon the third reflective element of about 12°±10° and a mean incidence angle upon the fourth reflective element of about 6.0°±10°.

8. The apparatus of claim 1, wherein the reflective optical elements are coaxial with respect to each other.

9. The apparatus of claim 1, wherein an aperture stop is accessibly located at or near the third reflective element.

10. The apparatus of claim 9, wherein the reflective focusing optics have an optical axis, and wherein the third reflective element is located on the optical axis.

11. The apparatus of claim 9, wherein the aperture stop is centered on the optical axis of the reflective focusing optics.

12. An optical system for use with a scanning ring field lithography apparatus, comprising:
a radiation source emitting extreme ultraviolet radiation of wavelengths ranging from approximately 4 to 20 nanometers;
a reflective mask for generating patterned images at the substrate;
reflective focusing optics positioned between the mask and the substrate comprising:
at least four reflective elements including a convex first reflective element;
at least one concave reflective element;
a convex third reflective element, arranged such that the convex first reflective element is positioned in closer proximity to the substrate than the convex third reflective element; and
wherein the reflective focusing optics project a focused image on and telecentric at the substrate in the shape of an arcuate slit and are characterized by a balanced static centroid distortion curve across the width of the arcuate slit.

13. The optical system of claim 12, wherein the at least one convex reflective element is a rotationally symmetric surface.

14. The optical system of claim 12, wherein the at least one concave reflective element is a rotationally symmetric surface.

15. The optical system of claim 12, wherein the at least one convex reflective element deviates from the best fitting spherical surface by less than approximately 11 μm.

16. The optical system of claim 12, wherein the at least one concave reflective element deviates from the best fitting spherical surface by less than approximately 14 μm.

17. The optical system of claim 12, wherein the at least one convex reflective element and the at least one concave reflective element have a reflective multilayer coating in which each layer has a substantially uniform thickness.

18. The optical system of claim 12, wherein the at least one convex reflective element and the at least one concave reflective element are coaxial with respect to each other.

* * * * *